(12) United States Patent
Yasuda et al.

(10) Patent No.: US 10,727,103 B2
(45) Date of Patent: Jul. 28, 2020

(54) SEMICONDUCTOR DEVICE, METHOD FOR PRODUCING THE SAME, AND LAMINATE

(71) Applicant: Shin-Etsu Chemical Co., Ltd., Tokyo (JP)

(72) Inventors: Hiroyuki Yasuda, Annaka (JP); Michihiro Sugo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/148,354

(22) Filed: Oct. 1, 2018

(65) Prior Publication Data

US 2019/0103299 A1 Apr. 4, 2019

(30) Foreign Application Priority Data

Oct. 3, 2017 (JP) .................. 2017-193635

(51) Int. Cl.
*H01L 21/683* (2006.01)
*H01L 23/31* (2006.01)
(Continued)

(52) U.S. Cl.
CPC ............ *H01L 21/6835* (2013.01); *C09J 7/38* (2018.01); *C09J 7/381* (2018.01); *C09J 161/06* (2013.01);
(Continued)

(58) Field of Classification Search
CPC ........... H01L 24/29; H01L 2221/68359; H01L 2224/03003; H01L 24/19; H01L 24/27; H01L 21/6835; H01L 23/3121; H01L 21/565; H01L 21/568; H01L 24/20; H01L 2224/16227; H01L 2924/181; H01L 24/92; H01L 2224/211; H01L 2221/68381; H01L 23/293; C09J 161/06; C09J 161/12; C09J 7/38; C09J 7/381; C09J 2499/00; C09J 2203/326; C09J 2205/302

See application file for complete search history.

(56) References Cited

U.S. PATENT DOCUMENTS 10,297,485 B2 * 5/2019 Yasuda .................. H01L 24/29
2003/0064305 A1 4/2003 Ono et al.
(Continued)

FOREIGN PATENT DOCUMENTS

JP 2003-177528 A 6/2003
JP 2013-58520 A 3/2013
(Continued)

*Primary Examiner* — Latanya N Crawford
(74) *Attorney, Agent, or Firm* — Westerman, Hattori, Daniels & Adrian, LLP

(57) ABSTRACT

Disclosed herein is a semiconductor device including: a support; a double-layered adhesive resin layer formed on the support, an insulating layer and a redistribution layer formed on the adhesive resin layer; a chip layer, and a mold resin layer, wherein the adhesive resin layer includes a resin layer A containing a resin decomposable by light irradiation and a resin layer B containing a non-silicone-based thermoplastic resin, the resin layer A and the resin layer B being provided in this order from the support side, the resin decomposable by light irradiation is a resin containing a fused ring in its main chain, and the non-silicone-based thermoplastic resin has a glass transition temperature of 200° C. or higher.

6 Claims, 1 Drawing Sheet

(51) Int. Cl.
*H01L 23/00* (2006.01)
*H01L 21/56* (2006.01)
*C09J 7/38* (2018.01)
*C09J 161/06* (2006.01)
*C09J 161/12* (2006.01)

(52) U.S. Cl.
CPC .......... *C09J 161/12* (2013.01); *H01L 21/565* (2013.01); *H01L 21/568* (2013.01); *H01L 23/3121* (2013.01); *H01L 24/19* (2013.01); *H01L 24/20* (2013.01); *C09J 2203/326* (2013.01); *C09J 2205/302* (2013.01); *C09J 2205/31* (2013.01); *C09J 2483/00* (2013.01); *C09J 2499/00* (2013.01); *H01L 24/13* (2013.01); *H01L 24/16* (2013.01); *H01L 24/81* (2013.01); *H01L 24/83* (2013.01); *H01L 24/92* (2013.01); *H01L 2221/68327* (2013.01); *H01L 2221/68345* (2013.01); *H01L 2221/68359* (2013.01); *H01L 2221/68381* (2013.01); *H01L 2224/0231* (2013.01); *H01L 2224/02371* (2013.01); *H01L 2224/16227* (2013.01); *H01L 2224/211* (2013.01); *H01L 2224/73204* (2013.01); *H01L 2224/81005* (2013.01); *H01L 2224/81447* (2013.01); *H01L 2224/83102* (2013.01); *H01L 2224/92125* (2013.01); *H01L 2924/181* (2013.01)

(56) References Cited

U.S. PATENT DOCUMENTS

2015/0376477 A1* 12/2015 Katami ................. G06F 3/0414
 345/173
2018/0277415 A1* 9/2018 Yasuda ................... H01L 24/19

FOREIGN PATENT DOCUMENTS

JP 2016-146402 A 8/2016
WO 2015/072418 A1 5/2015

* cited by examiner

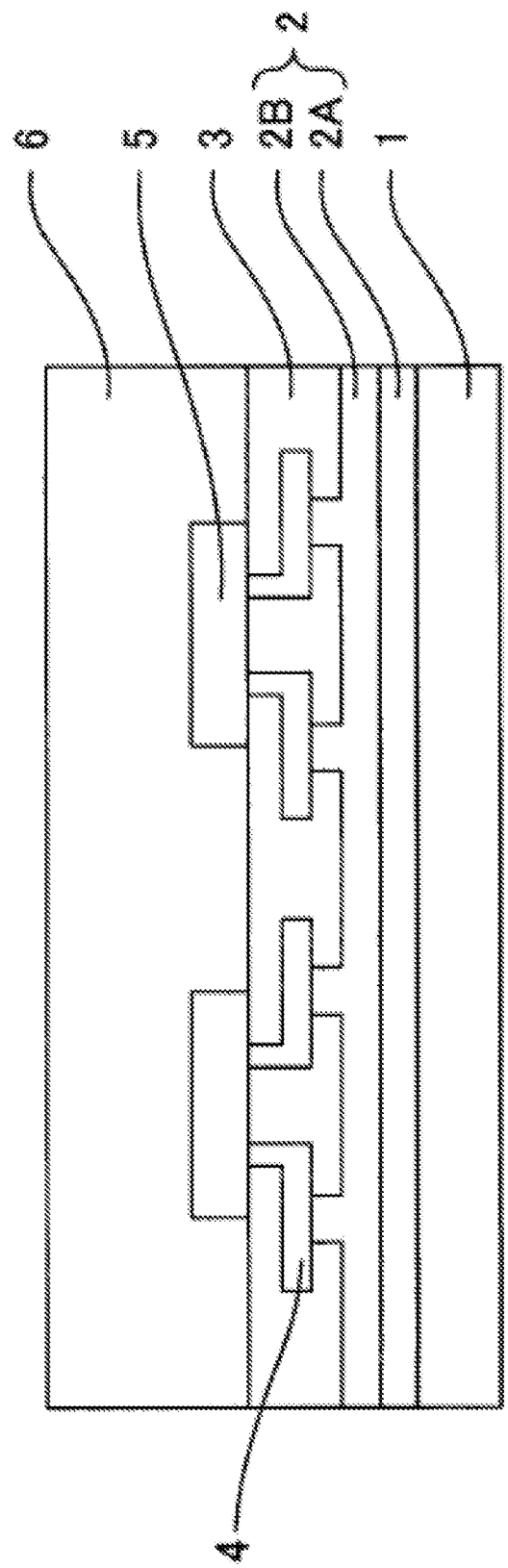

SEMICONDUCTOR DEVICE, METHOD FOR PRODUCING THE SAME, AND LAMINATE

CROSS-REFERENCE TO RELATED APPLICATION

This non-provisional application claims priority under 35 U.S.C. § 119(a) on Patent Application No. 2017-193635 filed in Japan on Oct. 3, 2017, the entire contents of which are hereby incorporated by reference.

TECHNICAL FIELD

The present invention relates to a semiconductor device, a method for producing the same, and a laminate.

BACKGROUND ART

Three-dimensional semiconductor packages have become essential to achieve higher density and capacity. Three-dimensional packaging technology is a semiconductor fabrication technology in which semiconductor chips are thinned and further stacked and interconnected by through-silicon vias (TSVs) to form a multilayer structure. Fabrication of such packages requires the step of thinning a substrate having a semiconductor circuit formed therein by grinding its non-circuit forming surface (also referred to as "back surface") and the step of forming TSVs and electrodes on the back surface. Prior to the step of grinding the back surface of a silicon substrate, a back surface protective tape is conventionally attached to the surface of the silicon substrate opposite to the surface to be ground to prevent the wafer from breaking during the grinding step. However, this tape uses an organic resin film as its supporting base material, and is therefore flexible but has insufficient strength and heat resistance. For this reason, this tape is not suitable for use in the TSV-forming step and the step of forming an interconnection layer on the back surface.

Therefore, a system has been proposed in which a semiconductor substrate is bonded to a support made of silicon or glass with an adhesive layer being interposed between them so that the semiconductor substrate can sufficiently withstand the step of grinding the back surface and the step of forming TSVs and electrodes on the back surface (Patent Documents 1 and 2). Such TSV-related technology is expected as the technology for high density interconnection between chips, especially the technology for connecting a high-bandwidth memory to a processor, but is now applied only to some limited applications because of high costs.

In recent years, FOWLP (Fan-Out Wafer Level Package) has received attention (Patent Document 3). This FOWLP is a package having a structure in which an insulated fine redistribution layer (RDL) is formed on an IC chip so as to be fanned out of the chip area. This package can achieve high-density wiring between a plurality of chips and have much smaller size and thickness than conventional packages.

Particularly, a technique called RDL first has been studied which involves direct processing of RDL formation on a support substrate, placement of device chips, and resin encapsulation in order to improve the accuracy of alignment of RDL with chips so that FOWLP can be applied also to an application processor having numerous terminals. The support substrate needs to be separated after RDL formation and packaging. However, this technique is different from a technique in which the back surface of a semiconductor substrate is processed after the semiconductor substrate is bonded to a support, and therefore there is a problem that the adhesive system used in the TSV forming technology cannot be applied to this technique.

Under the circumstances, a structure has recently been studied which has a release layer containing a laser-decomposable resin on a support (Patent Document 4). In this case, an RDL layer is directly formed on a release layer. However, when the release layer that remains on the RDL layer after the support is separated by laser irradiation is made of a thermoplastic resin that can be washed away with a solvent, there is a fear that the release layer deforms under high-temperature conditions for curing an insulating layer during formation of the RDL layer so that metal wirings also deform.

CITATION LIST

Patent Document 1: JP-A 2003-177528

Patent Document 2: WO 2015/072418

Patent Document 3: JP-A 2013-58520

Patent Document 4: JP-A 2016-146402

DISCLOSURE OF INVENTION

In view of the above problem, it is an object of the present invention to provide a semiconductor device that can be easily produced, has excellent thermal process resistance, achieves easy separation of a support, and can increase the productivity of semiconductor packages, a method for producing the same, and a laminate suitable for production of the semiconductor device.

The present inventors have intensively studied to achieve the above object, and as a result have found that the above object can be achieved by a semiconductor device including a support, a double-layered adhesive resin layer formed on the support, an insulating layer for use in forming a redistribution layer, a redistribution layer, a chip layer, and a mold resin layer, and a laminate for producing the semiconductor device. This finding has led to the completion of the present invention.

The present invention provides the following semiconductor device, method for producing the same, and laminate.

1. A semiconductor device including: a support; a double-layered adhesive resin layer formed on the support; an insulating layer and a redistribution layer formed on the adhesive resin layer; a chip layer; and a mold resin layer, wherein the adhesive resin layer includes a resin layer A containing a resin decomposable by light irradiation and a resin layer B containing a non-silicone-based thermoplastic resin, the resin layer A and the resin layer B being provided in this order from the support side, the resin decomposable by light irradiation is a resin containing a fused ring in its main chain, and the non-silicone-based thermoplastic resin has a glass transition temperature of 200° C. or higher.

2. The semiconductor device according to 1, wherein the resin layer A has a light transmittance at a wavelength of 355 nm of 20% or less.

3. The semiconductor device according to 1 or 2, wherein the resin layer A is formed of a cured product of a resin composition A containing a resin A having a repeating unit represented by the following formula (1):

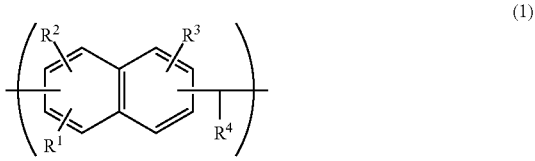

wherein $R^1$ to $R^3$ are each independently a hydrogen atom, a hydroxy group, or a monovalent organic group having 1 to 20 carbon atoms, at least one of $R^1$ to $R^3$ is a hydroxy group, and $R^4$ is a hydrogen atom or a monovalent organic group having 1 to 30 carbon atoms which may have a substituent.

4. The semiconductor device according to any one of 1 to 3, wherein the non-silicone-based thermoplastic resin contains an aromatic ring in its main chain.

5. A method for producing the semiconductor device according to any one of 1 to 4, including the steps of:
   (a) forming a resin layer A directly on a support;
   (b) forming a resin layer B on the resin layer A;
   (c) forming an insulating layer on the resin layer B and patterning the insulating layer;
   (d) forming a conductive layer on the patterned insulating layer;
   (e) forming a plating resist layer on the conductive layer and patterning the plating resist layer to expose the conductive layer between pattern features of the plating resist layer;
   (f) forming a redistribution layer on an exposed portion of the conductive layer between pattern features of the plating resist layer;
   (g) removing the plating resist layer to expose the conductive layer and removing the exposed conductive layer;
   (h) forming a second insulating layer after the step (g) and patterning the second insulating layer to expose the redistribution layer;
   (i) forming a chip layer on the redistribution layer;
   (j) filling a space between the chip layer and the insulating layer with an underfill agent; and
   (k) forming a mold resin layer on the chip layer.

6. A laminate including: a support; a double layered-adhesive resin layer formed on the support, an insulating layer formed on the adhesive resin layer; and a plating resist layer, wherein
   the adhesive resin layer includes a resin layer A containing a resin decomposable by light irradiation and a resin layer B containing a non-silicone-based thermoplastic resin, the resin layer A and the resin layer B being provided in this order from the support side, the resin decomposable by light irradiation is a resin containing a fused ring in its main chain, and the non-silicone-based thermoplastic resin has a glass transition temperature of 200° C. or higher.

Advantageous Effects of the Invention

According to the present invention, it is possible to provide a semiconductor device that has heat resistance and can achieve easy separation of a semiconductor substrate from a support while layers from an insulating layer to a redistribution layer on the support are tightly bonded and supported.

BRIEF DESCRIPTION OF THE DRAWING

The FIGURE is a cross-section view of an example semiconductor device of the invention.

DESCRIPTION OF THE PREFERRED EMBODIMENTS

Semiconductor Device and Laminate

A semiconductor device according to the present invention includes a support 1, a double-layered adhesive resin layer 2 formed on the support 1, an insulating layer 3 and a redistribution layer 4 formed on the adhesive resin layer 2, a chip layer 5, and a mold resin layer 6. The adhesive resin layer 2 includes a resin layer A (2A) containing a resin decomposable by light irradiation and a resin layer B (2B) containing a non-silicone-based thermoplastic resin, and the resin layer A (2A) and the resin layer B (2B) are provided in this order from the support 1 side. The resin decomposable by light irradiation contains a fused ring in its main chain. The non-silicone-based thermoplastic resin has a glass transition temperature of 200° C. or higher.

A laminate according to the present invention includes a support, a double-layered adhesive resin layer formed on the support, and a plating resist layer. A semiconductor device can be obtained by forming a redistribution layer and further forming a chip layer on the laminate.

Support

Examples of the support include a transparent substrate, a silicon substrate, and a ceramic substrate. From the viewpoint of transmission of laser light to be emitted to separate the support, a transparent substrate is preferred. As the transparent substrate, a glass substrate or a quartz substrate is usually used. The thickness of the transparent substrate is preferably 300 to 1,500 μm, more preferably 500 to 1,100 μm. The shape of the support is not particularly limited, but is preferably circular or rectangular.

Adhesive Resin Layer

The adhesive resin layer includes a resin layer A containing a resin decomposable by light irradiation and a resin layer B containing a non-silicone-based thermoplastic resin, and the resin layer A and the resin layer B are provided in this order from the support side.

Resin Layer A

The resin layer A is a resin layer having a light-shielding property (light-shielding layer), and the light transmittance of the resin layer A at a wavelength of 355 nm is preferably 20% or less, more preferably 18% or less, even more preferably 15% or less. Further, the light transmittance of the resin layer A at a wavelength of 300 to 500 nm is preferably 20% or less.

From the viewpoints of heat resistance, adhesion, and chemical resistance, the resin contained in the resin layer A preferably contains a fused ring in its main chain. Such a resin is particularly preferably one having a repeating unit represented by the following formula (1) (hereinafter, also referred to as resin A). It is to be noted that the resin may have only one type or two or more types of the repeating units represented by the formula (1).

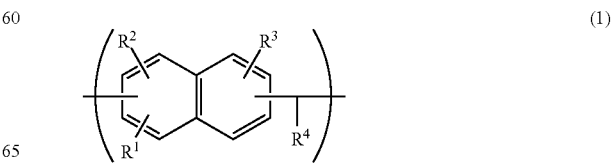

In the formula (1), $R^1$ to $R^3$ are each independently a hydrogen atom, a hydroxy group, or a monovalent organic group having 1 to 20 carbon atoms, preferably 1 to 10 carbon atoms, provided that at least one of $R^1$ to $R^3$ is a hydroxy group.

Examples of the monovalent organic group include: linear, branched, or cyclic alkyl groups having 1 to 20 carbon atoms, such as a methyl group, an ethyl group, an n-propyl group, an isopropyl group, an n-butyl group, a sec-butyl group, a tert-butyl group, an n-pentyl group, a neopentyl group, an n-hexyl group, an n-heptyl group, an n-octyl group, an n-nonyl group, an n-decyl group, an n-dodecyl group, an n-pentadecyl group, an n-icosyl group, a cyclopentyl group, a cyclohexyl group, a cyclopentylmethyl group, a cyclohexylmethyl group, a cyclopentylethyl group, a cyclohexylethyl group, a cyclopentylbutyl group, a cyclhexylbutyl group, and an adamantyl group; linear, branched, or cyclic alkoxy groups having 1 to 5 carbon atoms, such as a methoxy group; epoxy group-containing groups such as a glycidyloxy group; and aryl groups such as a phenyl group and a naphthyl group. Preferred examples of $R^1$ to $R^3$ include a hydrogen atom, a hydroxy group, and a methyl group.

In the formula (1), $R^4$ is a hydrogen atom or a monovalent organic group having 1 to 30 carbon atoms, preferably 1 to 10 carbon atoms, which may have a substituent. Examples of the monovalent organic group represented by $R^4$ include an alkyl group, a phenyl group, a naphthyl group, an anthracenyl group, and a norbornyl group, and at least one hydrogen atom in each of these groups may be substituted with an alkyl group, an aryl group, an aldehyde group, a halogen atom, a nitro group, a nitrile group, a hydroxy group, or the like.

The resin A can be obtained by a polycondensation reaction between naphthol or a derivative thereof and an aldehyde compound in a solvent or solventless system in the presence of an acid or base catalyst at room temperature or, if necessary, with cooling or heating.

Examples of the naphthol or a derivative thereof include 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 1-(4-hydroxyphenyl)naphthalene, 6-(4-hydroxyphenyl)-2-naphthol, 6-(cyclohexyl)-2-naphthol, 1,1'-bi-2-naphthol, 6,6'-bi-2-naphthol, 9,9-bis(6-hydroxy-2-naphthyl)fluorene, 6-hydroxy-2-vinylnaphthalene, 1-hydroxymethylnaphthalene, and 2-hydroxymethylnaphthalene. These naphthol and derivatives thereof may be used singly or in combination of two or more of them.

Examples of the aldehyde compound include those represented by the following formula:

$R^4$—CHO (wherein $R^4$ is as defined above).

Specific examples of the aldehyde compound include formaldehyde, trioxane, paraformaldehyde, acetaldehyde, propylaldehyde, adamantanecarbaldehyde, benzaldehyde, phenylacetaldehyde, α-phenylpropylaldehyde, β-phenylpropylaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthaldehyde, 2-naphthaldehyde, 2-hydroxy-1-naphthaldehyde, 4-hydroxy-1-naphthaldehyde, 1-hydroxy-2-naphthaldehyde, 3-hydroxy-2-naphthaldehyde, 6-hydroxy-2-naphthaldehyde, anthracenecarbaldehyde, pyrenecarbaldehyde, furfural, methylal, phthalaldehyde, isophthalaldehyde, terephthalaldehyde, naphthalenedicarbaldehyde, anthracenedicarbaldehyde, and pyrenedicarbaldehyde. These aldehyde compounds may be used singly or in combination of two or more of them.

Examples of the solvent used in the polycondensation reaction include: alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofuran (THF), and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and aprotic polar solvents such as dimethyl sulfoxide, N, N-dimethylformamide, and hexamethylphosphoric triamide. These solvents may be used singly or in combination of two or more of them. The amount of the solvent to be used is preferably 0 to 2,000 parts by weight, more preferably 10 to 2,000 parts by weight per 100 parts by weight of the total amount of the naphthol or a derivative thereof and the aldehyde compound.

Examples of the acid catalyst used in the polycondensation reaction include: inorganic acids such as hydrochloric acid, hydrobromic acid, sulfuric acid, nitric acid, phosphoric acid, and heteropolyacid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide.

Examples of the base catalyst used in the polycondensation reaction include: inorganic bases such as sodium hydroxide, potassium hydroxide, barium hydroxide, sodium carbonate, sodium hydrogen carbonate, potassium carbonate, lithium hydride, sodium hydride, potassium hydride, and calcium hydride; alkyl metals such as methyllithium, n-butyllithium, methylmagnesium chloride, and ethylmagnesium bromide; alkoxides such as sodium methoxide, sodium ethoxide, and potassium tert-butoxide; and organic bases such as triethylamine, diisopropylethylamine, N, N-dimethylaniline, pyridine, and 4-dimethylaminopyridine.

The amount of the catalyst to be used is preferably 0.001 to 100 parts by weight, more preferably 0.005 to 50 parts by weight per 100 parts by weight of the total amount of the naphthol or a derivative thereof and the aldehyde compound. The reaction temperature is preferably −50° C. to about the boiling point of the solvent, more preferably room temperature to 100° C.

The polycondensation reaction may be performed by a method in which the naphthol or a derivative thereof, the aldehyde, and the catalyst are charged at a time or a method in which the naphthol or a derivative thereof and the aldehyde are added dropwise in the presence of the catalyst.

The naphthol or a derivative thereof and the aldehyde compound are used so that the mole ratio of the aldehyde compound to the total of the naphthol or a derivative thereof is preferably 0.01 to 5, more preferably 0.05 to 2, even more preferably 0.05 to 1, most preferably 0.1 to 0.9.

After the completion of the polycondensation reaction, the unreacted raw materials and the catalyst present in the system may be removed by increasing the temperature in a reaction vessel to 130 to 230° C. and reducing the pressure in the reaction vessel (e.g., about 1 to 50 mmHg) to remove volatiles, or by adding an appropriate solvent or water to fractionate the polymer, or by dissolving the polymer in a good solvent to reprecipitate the polymer in a poor solvent. An appropriate one may be chosen from these techniques depending on the nature of the obtained reaction product.

The weight average molecular weight (Mw) of the resin A is preferably 500 to 500,000, more preferably 1,000 to 100,000. The dispersity of the resin A is preferably 1.2 to 20. However, when monomer components, oligomer components, or low-molecular-weight fractions having a Mw of less than 500 are cut off, the volatilization of volatile components during bake can be prevented, thereby preventing contamination around a bake cup or the occurrence of surface defects by re-deposition of volatile components. It is to be noted that in the present invention, Mw is measured versus polystyrene standards by gel permeation chromatography (GPC) using THF as a solvent.

The resin layer A is preferably formed of a cured product of a resin composition A containing the resin A.

The resin composition A preferably further contains a crosslinker for crosslinking the resin A by thermal reaction. As the crosslinker, an epoxy compound or an epoxy resin having two or more functional groups in its molecule, an amino compound such as methylolmelamine, or an amino resin is suitably used. In order to promote the crosslinking reaction between the crosslinker and the resin A, a catalyst is preferably further added.

Examples of the epoxy compound and the epoxy resin include di-, tri-, tetra-, or higher-multifunctional epoxy resins such as EOCN-1020 (see the following formula), EOCN-102S, XD-1000, NC-2000-L, EPPN-201, GAN, and NC6000 manufactured by Nippon Kayaku Co., Ltd. and those represented by the following formulas.

EOCN-1020

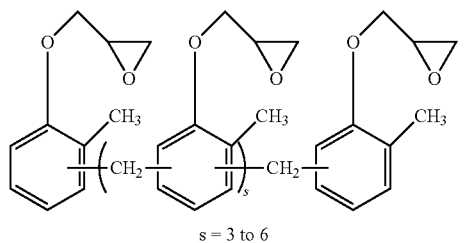

s = 3 to 6

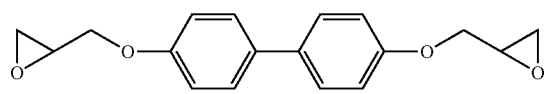

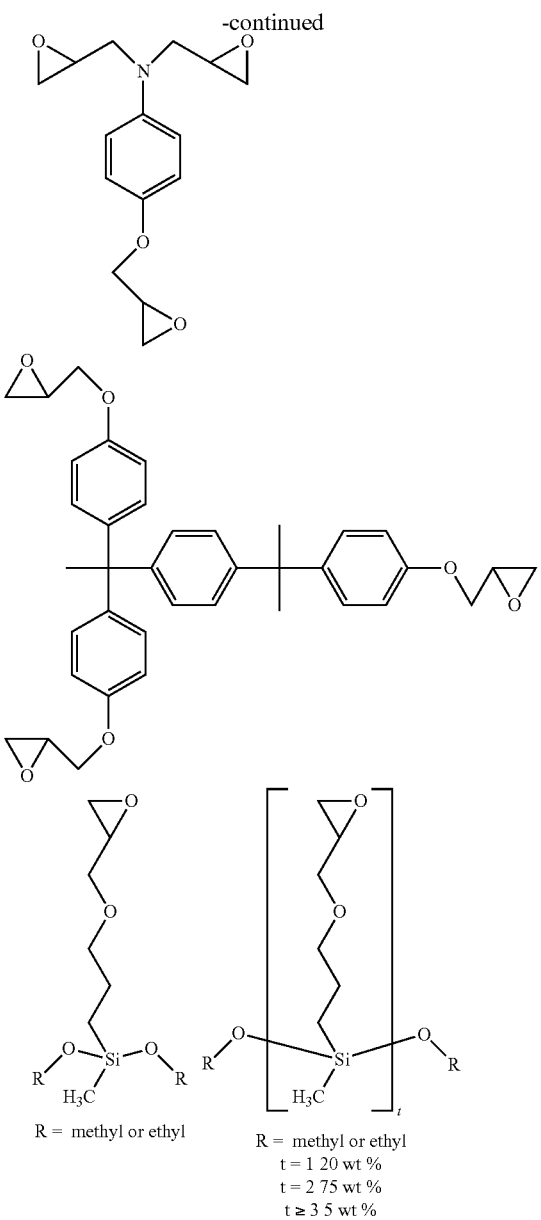

When the epoxy compound or the epoxy resin is used as a crosslinker, the amount thereof is preferably 0.1 to 50 parts by weight, more preferably 0.1 to 30 parts by weight, even more preferably 1 to 30 parts by weight per 100 parts by weight of the resin A having a repeating unit represented by the formula (1). The above-mentioned crosslinkers may be used singly or in combination of two or more of them. When the amount of the epoxy compound or the epoxy resin is within the above range, a sufficient crosslinking density is achieved so that the resulting cured product fully functions.

When the epoxy resin is used as a crosslinker, a curing accelerator is preferably added as a catalyst. The addition of an epoxy resin curing accelerator allows a curing reaction to adequately and uniformly proceed.

Examples of the epoxy resin cure accelerator include: imidazole compounds such as 2-methylimidazole, 2-ethylimidazole, 2-ethyl-4-methylimidazole, ethyl isocyanates of these compounds, 2-phenylimidazole, 2-phenyl-4-methylimidazole, 2-phenyl-4-methyl-5-hydroxymethylimidazole, and 2-phenyl-4,5-dihydroxymethylimidazole; DBU-based compounds such as 1,8-diazabicyclo[5.4.0]undecene-7 (DBU), 1,5-diazabicyclo[4.3.0]nonene-5 (DBN), organic acid salts of DBU, phenolic resin salts of DBU, and tetraphenylborate salts of DBU derivatives; triorganophosphines such as triphenylphosphine, tributylphosphine, tris(p-methylphenyl)phosphine, tris(p-methoxyphenyl)phosphine, tris (p-ethoxyphenyl)phosphine, triphenylphosphine-triphenylborate, and tetraphenylphosphine-tetraphenylborate; quaternary phosphonium salts; and tertiary amines such as triethyleneammonium-triphenylborate and tetraphenyl boric acid salts thereof. These epoxy resin curing accelerators may be used singly or in combination of two or more of them.

When the epoxy resin curing accelerator is used, the amount thereof is preferably 0.1 to 10 parts by weight, more preferably 0.2 to 5 parts by weight per 100 parts by weight of the resin A.

The amino compound such as methylolmelamine or the amino resin used in the present invention may be at least one compound selected from the group consisting of amino condensates modified with formalin or formalin-alcohol and phenol compounds having, on average, two or more methylol groups or alkoxy methylol groups per molecule.

The amino compound or the amino resin preferably has a Mw of 150 to 10,000, and more preferably has a Mw of 200 to 3,000. When the Mw is within the above range, sufficient curability is achieved so that the cured composition has excellent heat resistance.

Examples of the amino condensates modified with formalin or formalin-alcohol include melamine condensates modified with formalin or formalin-alcohol and urea condensates modified with formalin or formalin-alcohol.

The melamine condensate modified with formalin or formalin-alcohol can be prepared by, for example, modifying a melamine monomer with formalin into a methylol form according to a known method or further modifying it with an alcohol into an alkoxy form to obtain a modified melamine represented by the following formula (2). It is to be noted that the alcohol is preferably a lower alcohol such as an alcohol having 1 to 4 carbon atoms.

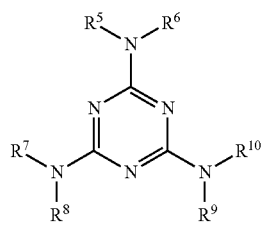

(2)

In the formula, $R^5$ to $R^{10}$ are each independently a methylol group, an alkoxymethyl group containing a linear, branched, or cyclic alkoxy group having 1 to 4 carbon atoms, or a hydrogen atom, and at least one of $R^5$ to $R^{10}$ is a methylol group or an alkoxymethyl group.

Examples of the modified melamine represented by the formula (2) include trimethoxymethyl monomethylol melamine, dimethoxymethyl monomethylol melamine, trimethylol melamine, hexamethylol melamine, and hexamethoxymethyl melamine. Then, the modified melamine or a multimer thereof (e.g., an oligomer such as a dimer or a trimer) is subjected to addition polycondensation with formaldehyde according to an ordinary method until a desired molecular weight is reached. In this way, a melamine condensate modified with formalin or formalin-alcohol is obtained. It is to be noted that at least one modified melamine condensate selected from the modified melamines and condensates thereof can be used as a crosslinker.

The urea condensate modified with formalin or formalin-alcohol can be prepared by, for example, modifying a urea condensate having a desired molecular weight with formalin into a methylol form according to a known method or further modifying it with an alcohol into an alkoxy form. Specific examples of the modified urea condensate include a methoxymethylated urea condensate, an ethoxymethylated urea condensate, and a propoxymethylated urea condensate. It is to be noted that these modified urea condensates may be used singly or in combination of two or more of them.

Examples of the phenol compound having, on average, two or more methylol groups or alkoxy methylol groups per molecule include (2-hydroxy-5-methyl)-1,3-benzenedimethanol and 2,2',6,6'-tetramethoxymethylbisphenol A.

These amino condensates or phenol compounds may be used singly or in combination of two or more of them.

It is to be noted that when the amino compound such as methylol melamine or the amino resin is used as a crosslinker, a thermal acid generator is preferably added as a catalyst. The thermal acid generator is not particularly limited, but may be, for example, an ammonium salt represented by the following formula (3).

(3)

In the formula, $R^{11}$ to $R^{14}$ are each independently a hydrogen atom, a linear, branched, or cyclic alkyl group having 1 to 12 carbon atoms, a linear, branched, or cyclic alkenyl group having 2 to 12 carbon atoms, an aryl group having 6 to 20 carbon atoms, or an aralkyl or aryloxyalkyl group having 7 to 12 carbon atoms, at least one hydrogen atom of each of these groups may be substituted with an oxo group, and at least one or all of the hydrogen atoms of each of these groups may be substituted with alkoxy groups. Two of $R^{11}$ to $R^{14}$ may form a ring with the nitrogen atom to which they are bonded, in which case the ring is a $C_3$-$C_{10}$ aliphatic ring having the nitrogen atom therein or a $C_5$-$C_{10}$ heteroaromatic ring having the nitrogen atom therein. $X^-$ is a sulfonate ion having at least one fluorine atom at the α-position, a perfluoroalkylimide ion, or a perfluoroalkylmethide ion.

Specific examples of $X^-$ include: perfluoroalkanesulfonate anions such as a triflate anion and a nonaflate anion; sulfonate anions having at least one fluorine atom at the α-position; imide anions such as a bis(trifluoromethylsulfonyl)imide anion, a bis(perfluoroethylsulfonyl)imide anion, a bis(perfluorobutylsulfonyl imide anion; and methanide anions such as a tris(trifluoromethylsulfonyl)methanide anion and a tris(perfluoroethylsulfonyl)methanide anion.

When the thermal acid generator is added, the amount thereof is preferably 0.1 to 15 parts by weight, more preferably 0.2 to 10 parts by weight per 100 parts by weight of the resin A. When the amount of the thermal acid generator is within the above range, the resin composition A is fully cured and also has excellent storage stability.

The resin composition A may contain a solvent. Examples of the solvent include: ketones such as cyclohexanone, cyclopentanone, and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone. These solvents may be used singly or in combination of two or more of them. When the solvent is contained, the amount thereof is preferably 100 to 5,000 parts by weight, more preferably 150 to 2,500 parts by weight per 100 parts by weight of the resin A.

Further, the resin composition A may be used also as a solvent-free film-form composition.

If necessary, the resin composition A may contain a surfactant or an antioxidant for further improving heat resistance.

Examples of the surfactant include, but are not limited to, nonionic surfactants such as polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenol ether and polyoxyethylene nonyl phenol ether; polyoxyethylene polyoxypropylene block copolymers; sorbitan fatty acid esters such as sorbitan monolaurate, sorbitan monopalmitate, and sorbitan monostearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as EFTOP® EF301, EF303, and EF352 (manufactured by Tohkem Products Co., Ltd.), MEGAFACE® F171, F172, and F173 (manufactured by DIC Corporation), Fluorad® FC430 and FC431 (manufactured by 3M), and AsahiGuard AG710, SURFLON® S-381, S-382, SC101, SC102, SC103, SC104, SC105, and SC106, and SURFYNOL® E1004, KH-10, KH-20, KH-30, and KH-40 (manufactured by Asahi Glass Co., Ltd.); organosiloxane polymers KP341, X-70-092, X-70-093, and X-70-1102 (manufactured by Shin-Etsu Chemical Co., Ltd.); and acrylic or methacrylic POLYFLOW No. 75 and No. 95 (manufactured by Kyoeisha Chemical Co., Ltd.). These surfactants may be used singly or in combination of two or more of them.

The antioxidant is preferably at least one selected from a hindered phenol-based compound, a hindered amine-based compound, an organophosphorus compound, and an organosulfur compound.

Preferred examples of the hindered phenol-based compound include, but are not limited to, 1,3,5-trimethyl-2,4,6-tris(3,5-di-tert-butyl-4-hydroxybenzyl)benzene (trade name: IRGANOX 1330), 2,6-di-tert-butyl-4-methylphenol (trade name: Sumilizer BHT), 2,5-di-tert-butyl-hydroquinone (trade name: Nocrac NS-7), 2,6-di-tert-butyl-4-ethylphenol (trade name: Nocrac M-17), 2,5-di-tert-pentylhydroquinone (trade name: Nocrac DAH), 2,2'-methylenebis(4-methyl-6-tert-butylphenol) (trade name: Nocrac NS-6), 3,5-di-tert-butyl-4-hydroxybenzylphosphonate diethyl ester (trade name: IRGANOX 1222), 4,4'-thiobis(3-methyl-6-tert-butylphenol) (trade name: Nocrac 300), 2,2'-methylenebis(4-ethyl-6-tert-butylphenol) (trade name: Nocrac NS-5), 4,4'-butylidenebis(3-methyl-6-tert-butylphenol) (trade name: ADK STAB AO-40), 2-tert-butyl-6-(3-tert-butyl-2-hydroxy-5-methylbenzyl)-4-methylphenyl acrylate (trade name: Sumilizer GM), 2-[1-(2-hydroxy-3,5-di-tert-pentylphenypethyl]-4,6-di-tert-pentylphenylacrylate (trade name: Sumilizer GS), 2,2'-methylenebis[4-methyl-6-(α-methyl-cyclohexyl)phenol], 4,4'-methylenebis(2,6-di-tert-butylphenol) (trade name: SEENOX 226M), 4,6-bis(octylthiomethyl)-o-cresol (trade name: IRGANOX 1520L), 2,2'-ethylenebis(4,6-di-tert-butylphenol), octadecyl-3-(3,5-di-tert-butyl-4-hydroxyphenyl)propionate (trade name: IRGANOX 1076), 1,1,3-tris-(2-methyl-4-hydroxy-5-tert-butylphenyl)butane (trade name: ADK STAB AO-30), tetrakis[methylene-(3,5-di-tert-butyl-4-hydroxyhydrocinnamate)]methane (trade name: ADK STAB AO-60), triethylene glycol bis[3-(3-tert-butyl-5-methyl-4-hydroxyphenyl)-propionate] (trade name: IRGANOX 245), 2,4-bis(n-octylthio)-6-(4-hydroxy-3,5-di-tert-butylanilino)-1,3,5-triazine (trade name: IRGANOX 565), N,N'-hexamethylenebis(3,5-di-tert-butyl-4-hydroxyhydrocinnamide) (trade name: IRGANOX 1098), 1,6-hexanediol-bis[3-(3,5-di-tert-butyl-4-hydroxyphenyl)propionate] (trade name: IRGANOX 259), 2,2-thio-diethylenebis[3-(3,5-di-tert-butyl-4-hydroxyphenyl)propionate] (trade name: IRGANOX 1035), 3,9-bis[2-[3-(3-tert-butyl-4-hydroxy-5-methylphenyl)propionyloxy]1,1-dimethylethyl]-2,4,8,10-tetraoxaspiro[5.5]undecane (trade name: Sumilizer GA-80), tris(3,5-di-tert-butyl-4-hydroxybenzypisocyanurate (trade name: IRGANOX 3114), calcium bis(ethyl 3,5-di-tert-butyl-4-hydroxybenzylphosphonate)/polyethylene wax 50/50 mixture (trade name: IRGANOX 1425WL), isooctyl-3-(3,5-di-tert-butyl-4-hydroxyphenyl)-propionate (trade name: IRGANOX 1135), 4,4'-thiobis(6-tert-butyl-3-methylphenol) (trade name: Sumilizer WX-R), and 6-[3-(3-tert-butyl-4-hydroxy-5-methylphenyl)propoxy]-2,4,8,10-tetra-tert-butyldibenz[d,f][1,3,2]dioxaphosphepin (trade name: Sumilizer GP).

Preferred examples of the hindered amine-based compound include, but are not limited to, p,p'-dioctyldiphenylamine (trade name: IRGANOX 5057), phenyl-α-naphthylamine (trade name: Nocrac PA), poly(2,2,4-trimethyl-1,2-dihydroquinoline) (trade name: Nocrac 224, 224-S), 6-ethoxy-2,2,4-trimethyl-1,2-dihydroquinoline (trade name: Nocrac AW), N,N'-diphenyl-p-phenylenediamine (Nocrac DP), N,N'-di-β-naphthyl-p-phenylenediamine (trade name: Nocrac White), N-phenyl-N'-isopropyl-p-phenylenediamine (trade name: Nocrac 810NA), N,N'-diallyl-p-phenylenediamine (trade name: Nonflex TP), 4,4'-(α,α-dimethylbenzyl)diphenylamine (trade name: Nocrac CD), p,p-toluenesulfonylaminodiphenylamine (trade name: Nocrac TD), N-phenyl-N'-(3-methacryloxy-2-hydroxypropyl)-p-phenylenediamine (trade name: Nocrac G1), N-(1-methylheptyl)-N'-phenyl-p-phenylenediamine (trade name: Ozonon 35), N,N'-di-sec-butyl-p-phenylenediamine (trade name: Sumilizer BPA), N-phenyl-N'-1,3-dimethylbutyl-p-phenylenediamine (trade name: Antigene 6C), alkylated diphenylamine (trade name: Sumilizer 9A), dimethyl succinate-1-(2-hydroxyethyl)-4-hydroxy-2,2,6,6-tetramethylpiperidine polycondensate (trade name: Tinuvin 622LD), poly[[6-(1,1,3,3-tetramethylbutypamino-1,3,5-triazine-2,4-diyl][(2,2,6,6-tetramethyl-4-piperidypimino]hexamethylene[(2,2,6,6-tetramethyl-4-piperidypimino]](trade name: CHIMASSORB 944), N,N'-bis(3-aminopropyl)ethylenediamine-2,4-bis[[N-butyl-N-(1,2,2,6,6-pentamethyl-4-piperidyl)amino]-6-chloro-1,3,5-triazine condensate (trade name: CHIMASSORB 119FL), bis(1-octyloxy-2,2,6,6-tetramethyl-4-piperidyl)sebacate (trade name: TINUVIN 123), bis(2,2,6,6-tetramethyl-4-piperidyl)sebacate (trade name: TINUVIN 770), bis(1,2,2,6,6-pentamethyl-4-piperidyl)-2-n-butyl-2-(3,5-di-tert-butyl-4-hydroxybenzyl)malonate (trade name: TINUVIN 144), bis(1,2,2,6,6-pentamethyl-4-piperidyl) sebacate (trade name: TINUVIN 765), tetrakis(1,2,2,6,6-pentamethyl-4-piperidyl) 1,2,3,4-butanetetracarboxylate (trade name: LA-57), tetrakis(2,2,6,6-tetramethyl-4-piperidyl) 1,2,3,4-butanetetracarboxylate (trade name: LA-52), an esterified mixture of 1,2,3,4-butanetetracarboxylic acid with 1,2,2,6,6-pentamethyl-4-piperidinol and 1-tridecanol (trade name: LA-62), an esterified mixture of 1,2,3,4-butanetetracarboxylic acid with 2,2,6,6-tetramethyl-4-piperidinol and 1-tridecanol (trade name: LA-67), an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P), an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (trade name: LA-68LD), (2,2,6,6-tetramethylene-4-piperidyl)-2-propylenecarboxylate (trade name: ADK STAB LA-82), and (1,2,2,6,6-pentamethyl-4-piperidyl)-2-propylenecarboxylate (trade name: ADK STAB LA-87).

Preferred examples of the organophosphorus compound include, but are not limited to, bis(2,4-di-tert-butylphenyl) [1,1-biphenyl]-4,4'-diyl bisphosphite, 9,10-dihydro-9-oxa-10-phosphaphenanthrene-10-oxide (trade name: SANKO-HCA), triethyl phosphite (trade name: JP302), tri-n-butyl phosphite (trade name: JP304), triphenyl phosphite (trade name: ADK STAB TPP), diphenyl monooctyl phosphite (trade name: ADK STAB C), tri(p-cresyl) phosphite (trade name: Chelex-PC), diphenyl monodecyl phosphite (trade name: ADK STAB 135A), diphenyl mono(tridecyl) phosphite (trade name: JPM313), tris(2-ethylhexyl) phosphite (trade name: JP308), phenyl didecyl phosphite (trade name: ADK STAB 517), tridecyl phosphite (trade name: ADK STAB 3010), tetraphenyl dipropylene glycol diphosphite (trade name: JPP100), bis(2,4-di-tert-butylphenyl) pentaerythritol diphosphite (trade name: ADK STAB PEP-24G), tris(tridecyl) phosphite (trade name: JP333E), bis (nonylphenyl) pentaerythritol diphosphite (trade name: ADK STAB PEP-4C), bis(2,6-di-tert-butyl-4-methylphenyl) pentaerythritol diphosphite (trade name: ADK STAB PEP-36), bis[2,4-di(1-phenylisopropyl)phenyl]pentaerythritol diphosphite (trade name: ADK STAB PEP-45), trilauryl trithiophosphite (trade name: JPS312), tris(2,4-di-tert-butylphenyl) phosphite (trade name: IRGAFOS 168), tris(nonylphenyl) phosphite (trade name: ADK STAB 1178), distearyl pentaerythritol diphosphite (trade name: ADK STAB PEP-8), tris(mono, dinonylphenyl) phosphite (trade name: ADK STAB 329K), trioleyl phosphite (trade name: Chelex-OL), tristearyl phosphite (trade name: JP318E), 4,4'-butylidene bis(3-methyl-6-tert-butylphenylditridecyl) phosphite (trade name: JPH1200), tetra($C_{12}$-$C_{15}$ mixed alkyl)-4,4'-isopropylidene diphenyl diphosphite (trade name: ADK STAB 1500), tetra(tridecyl)-4,4'-butylidene bis(3-methyl-6-tert-butylphenol) diphosphite (trade name: ADK STAB 260), hexa(tridecyl)-1,1,3-tris(2-methyl-5-tert-butyl-4-hydroxyphenyObutane-triphosphite (trade name: ADK STAB 522A), hydrogenated bisphenol A phosphite polymer (HBP), tetrakis(2,4-di-tert-butylphenyloxy)-4,4'-biphenylene di-phosphine (trade name: P-EPQ), tetrakis(2,4-di-tert-butyl-5-methylphenyloxy)-4,4'-biphenylene-di-phosphine (trade name: GSY-101P), 2-[[2,4,8,10-tetrakis(1,1-dimethylethyl)dibenzo[d,f][1,3,2]dioxaphosphepin-6-yl]oxy]-N,N-bis[2-[[2,4,8,10-tetrakis(1,1-dimethylethyl)dibenzo[d,f][1,3,2]dioxaphosphepin-6-yl]oxy]-ethyl]ethanamine (trade name: IRGAFOS 12), and 2,2'-methylenebis(4,6-di-tert-butylphenyl)octyl phosphite (trade name: ADK STAB HP-10).

Preferred examples of the organosulfur compound include, but are not limited to, dilauryl 3,3'-thiodipropionate (trade name: Sumilizer TPL-R), dimyristyl-3,3'-thiodipropionate (trade name: Sumilizer TPM), distearyl-3,3'-thiodipropionate (trade name: Sumilizer TPS), pentaerythritol tetrakis(3-laurylthiopropionate) (trade name: Sumilizer TP-D), ditridecyl-3,3'-thiodipropionate (trade name: Sumilizer TL), 2-mercaptobenzimidazole (trade name: Sumilizer MB), ditridecyl-3,3'-thiodipropionate (trade name: ADK STAB AO-503A), 1,3,5-tris-β-stearylthiopropionyloxyethyl isocyanurate, didodecyl 3,3'-thiobispropionate (trade name: IRGANOX PS 800FL), and dioctadecyl 3,3'-thiobispropionate (trade name: IRGANOX PS 802FL).

Among these antioxidants, tetrakis[methylene-(3,5-di-tert-butyl-4-hydroxyhydrocinnamate)]methane is particularly preferred. The amount of the antioxidant to be added is preferably 0.5 to 5 parts by weight, more preferably 1 to 3 parts by weight per 100 parts by weight of the resin A. When the amount of the antioxidant to be added is within the above range, adequate heat resistance and compatibility are achieved. It is to be noted that these antioxidants may be used singly or in combination of two or more of them.

In order to further enhance heat resistance, a known filler such as silica may be added to the resin composition A in an amount of 50 parts by weight or less per 100 parts by weight of the resin A.

When the resin composition A is a solution, a resin composition layer A' is formed by applying the resin composition A on a support by a method such as spin coating, roll coating, die coating, printing, or dipping and then performing pre-baking at a temperature of preferably 80 to 200° C., more preferably 100 to 180° C. depending on the volatility of a solvent used.

On the other hand, when the resin composition A is a film-form composition, a resin composition A' can be formed on a support by lamination.

The resin composition layer A' formed on the support is further heat-cured so as to function as a resin layer A. The heat curing can be performed using a hot plate or an oven usually at 100 to 350° C. for 5 to 150 minutes, preferably at 150 to 300° C. for 10 to 120 minutes. The curing reaction is preferably performed before a resin layer B is formed on the resin layer A.

The thickness of the resin layer A formed on the support is preferably 0.1 to 50 μm, more preferably 0.3 to 30 μm. When the thickness of the resin layer A is within the above range, the resin layer A has an adequate light-shielding property and excellent flatness.

Resin Layer B

A resin layer B contains a non-silicone-based thermoplastic resin (siloxane skeleton-free thermoplastic resin), and the glass transition temperature of the non-silicone-based thermoplastic resin is 200° C. or higher. If the glass transition temperature is lower than 200° C., there is a fear that the resin layer B flows and deforms when an insulating layer is formed on the resin layer B so that separation occurs at the interface between the insulating layer and the resin layer B or cracking occurs in the insulating layer.

The glass transition temperature is preferably 205° C. or higher, more preferably 210° C. or higher. The upper limit of the glass transition temperature is not particularly limited, but when the glass transition temperature is about 400° C. or lower, adhesion to the insulating layer is maintained so that a laminate can be more stably produced. It is to be noted that in the present invention, the glass transition temperature can be measured using a known dynamic viscoelasticity meter.

From the viewpoint of applicability onto the resin layer A, a non-silicone-based thermoplastic resin containing an aromatic ring in its main chain is preferably used to form the resin layer B. Such a material has excellent spin-coatability on the resin layer A. The Mw of the non-silicone-based thermoplastic resin is preferably 10,000 to 200,000, more preferably 15,000 to 150,000.

Examples of the non-silicone-based thermoplastic resin include a polyimide resin (AURUM® PL450C (Tg: 250° C.) manufactured by Mitsui Chemicals, Inc.), polyarylate resins (UNIFINERO M-2040 (Tg: 220° C.), M-2000H (Tg: 270° C.) manufactured by UNITIKA LTD.), a polyphenylene ether resin (ZYLON® S201A (Tg: 216° C.) manufactured by Asahi Kasei Corporation), and a polyether sulfone resin (SUMIKAEXCEL® PES 4800G (Tg: 240° C.) manufactured by Sumitomo Chemical Co., Ltd.). Among them, a polyarylate resin M-2040 is preferably used from the viewpoint of solubility.

The resin layer B is preferably formed of a cured product of a resin composition B containing the non-silicone-based thermoplastic resin.

The resin composition B may contain an antioxidant for improving its heat resistance and a surfactant for improving coatability. An example of the antioxidant includes di-tert-butylphenol. An example of the surfactant includes a fluorosilicone-based surfactant X-70-1102 (manufactured by Shin-Etsu Chemical Co., Ltd.).

The resin composition B may contain a solvent. Preferable examples of the solvent include cyclopentanone, cyclohexanone, N-methyl-2-pyrrolidone, p-menthane, pinene, isooctane, toluene, xylene, and mesitylene. From the viewpoint of the coatability of the resin composition B, cyclopentanone, cyclohexanone, N-methyl-2-pyrrolidone, xylene, and mesitylene are more preferred. These solvents may be used singly or in combination of two or more of them. The amount of the solvent is preferably 250 to 5,000 parts by weight, more preferably 300 to 4,000 parts by weight per 100 parts by weight of the non-silicone-based thermoplastic resin.

Further, the resin composition B may be used also as a solvent-free film-form composition.

When the resin composition B is a solution, the resin layer B can be formed by applying the resin composition B onto the resin layer A by a method such as spin coating, roll coating, die coating, slit coating, printing, or dipping and then heating it on a hot plate or in an oven. At this time, the heating is performed usually at 100 to 200° C. for 1 to 15 minutes, preferably at 130 to 190° C. for 2 to 10 minutes.

On the other hand, when the resin composition B is a film-form composition, the resin layer B can be formed on the resin layer A by lamination.

The thickness of the resin layer B is preferably 0.5 to 70 μm, more preferably 1 to 50 μm. When the thickness of the resin layer B is within the above range, there is no fear that the solvent remains due to poor heating, and an insulating layer having improved flatness can be formed.

The insulating layer, the redistribution layer, the chip layer, and the mold resin layer are described below with reference to a method for producing a semiconductor device.

A method for producing a semiconductor device according to the present invention includes the following steps.

Step (a)

Step (a) is a step of forming a resin layer A having a light-shielding property on a support. When a resin composition A for forming the resin layer A is in the form of a solution, the resin composition A is applied on a support by a method such as spin coating or roll coating, and the resulting coating is pre-baked at a temperature of preferably 80 to 200° C., more preferably 100 to 180° C. depending on the volatility of a solvent used to volatilize the solvent. In this way, a resin composition layer A' is formed. When the resin composition A is a film-form composition, a resin composition layer A' is formed on a support by lamination.

The resin composition layer A' formed on the support is heat-cured so as to function as a resin layer A. The heat curing can be performed using a hot plate or an oven usually at a temperature of 100 to 350° C., preferably at a temperature of 150 to 300° C. The curing time is usually 5 to 150 minutes, preferably 10 to 120 minutes.

Step (b)

Step (b) is a step of forming a resin layer B on the resin layer A. When a resin composition B is in the form of a solution, the resin composition B is applied on the resin layer A by a method such as spin coating, roll coating, die coating, printing, or dipping, and then the resulting coating is heated at 130 to 190° C. on a hot plate or in an oven to form a resin layer B.

On the other hand, when the resin composition B is a film-form composition, the resin layer B can be formed on the resin layer A by lamination.

Step (c)

Step (c) is a step of forming, on the resin layer B, an insulating layer for use in forming a redistribution layer and patterning the insulating layer. The insulating layer is not particularly limited. The insulating layer may be made of any material known in the semiconductor field, but is preferably made of a resin material such as an epoxy resin, a polyimide resin, a silicone resin, a modified silicone resin, polybenzoxazole (PBO), or a copolymer thereof.

A method for forming the insulating layer is not particularly limited, and the insulating layer can be formed by any known technique. For example, the insulating layer can be formed by a method in which a composition containing the above-described resin material is prepared and applied on the resin layer B by a coating method such as spin coating or roll coating or a method in which the composition is formed into a film and the film is laminated on the resin layer B by vacuum lamination. It is to be noted that after being applied, the composition may be heated at 50 to 300° C., preferably 100 to 250° C., if necessary. The thickness of the insulating layer is preferably 0.1 to 100 μm, more preferably 0.5 to 40 μm, even more preferably 1 to 35 μm.

A method for patterning the insulating layer is not particularly limited, either, and the insulating layer can be patterned by any conventionally-known method. For example, the patterning can be performed by photolithography. In this case, after the insulating layer is formed, exposure and development are performed to pattern the insulating layer.

Step (d)

Step (d) is a step of forming a conductive layer on the patterned insulating layer. The conductive layer is formed by, for example, sputtering Ti, Cu, or Ti/Cu. This conductive layer is necessary for forming a redistribution layer described later. The thickness of the conductive layer is preferably 0.01 to 2 μm, more preferably 0.02 to 1 μm.

Step (e)

Step (e) is a step of forming, on the conductive layer, a plating resist layer for forming a redistribution layer, patterning the plating resist layer, and exposing the conductive layer between pattern features of the plating resist layer. The plating resist layer is not particularly limited, and may be made of a commonly-used material, preferably a positive resist material for i-line lithography. The resist layer is preferably formed to have a thickness of about 0.1 to 100 µm. The plating resist layer can be patterned by, for example, photolithography.

Step (f)

Step (f) is a step of forming a redistribution layer on the conductive layer exposed between pattern features of the plating resist layer. The redistribution layer can be formed by plating the conductive layer, and the plating is preferably electroplating of a metal such as copper or an alloy such as a copper/gold alloy or a copper/nickel/gold alloy. The thickness of the redistribution layer is preferably 0.5 to 30 µm, more preferably 1.0 to 20 µm.

Step (g)

Step (g) is a step of removing the plating resist layer and further removing the exposed conductive layer. The plating resist layer can be removed by a method known in the semiconductor field. For example, the plating resist layer can be removed by using a solvent such as cyclopentanone or propylene glycol monomethyl ether acetate. The exposed conductive layer can also be removed by a method known in the semiconductor field. When made of Ti, the exposed conductive layer can be removed using buffered hydrofluoric acid, and when made of Cu, the exposed conductive layer can be removed using phosphoric acid water.

Step (h)

Step (h) is a step of forming a second insulating layer after the step (g), and patterning the second insulating layer to expose the redistribution layer. The insulating layer may be the same as that formed in Step (c). Patterning of the second insulating layer makes it possible to provide openings through which portions of the redistribution layer, which are necessary for connecting a chip in a subsequent step, are exposed.

Step (i)

Step (i) is a step of forming a chip layer on the redistribution layer exposed through the openings provided in the second insulating layer. The chip layer may be formed by, for example, plating a metal such as Sn, Ag, Au, Cu, Ni, Pd, or Pt or an alloy thereof on a substrate to form bumps thereon and flip-connecting the bump-bearing substrate onto the redistribution layer.

Step (j)

Step (j) is a step of filling a space between the chip layer and the insulating layer with an underfill agent. The filling with the underfill agent can be performed by any method known in the semiconductor field. For example, a space between the chip layer and the insulating layer may be filled with an epoxy-based material by capillary action.

Step (k)

Step (k) is a step of forming a mold resin layer on the chip layer. More specifically, the obtained semiconductor device is further sealed with a mold material to obtain a desired semiconductor device. The mold material is, for example, a material obtained by adding an inorganic filler such as silica or titanium oxide to a resin such as a silicone resin or an epoxy resin. The sealing can be achieved using such a mold material, and the mold material may be heat-cured, if necessary. The thickness of the mold resin layer is not particularly limited, but is usually about 10 to 500 µm.

It is to be noted that the support can be separated by, for example, irradiation with laser light of wavelength 355 nm. After separating the support, the resin layer B remaining on the semiconductor device is washed with a solvent to obtain a desired semiconductor laminate. It is to be noted that when residues remain, oxygen plasma or the like may further be applied to remove the residues. Further, the semiconductor laminates may be stacked in multiple layers to obtain a high-density semiconductor package.

EXAMPLES

The present invention is more specifically described below with reference to Preparation Examples, Examples, and Comparative Examples, but the present invention is not limited to these Examples. It is to be noted that weight-average molecular weight (Mw) and number-average molecular weight (Mn) are measured versus polystyrene standards by GPC using THF as a solvent. An acid generator AG and a crosslinker, NIKALAC Mw390 used in the following Examples are as follows.

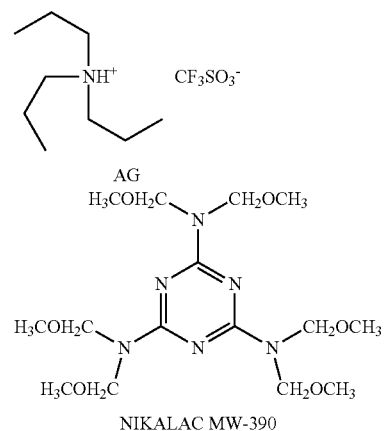

[1] Preparation of Resin Composition

Preparation Example 1

First, 80 g (0.50 mol) of 1,5-dihydroxynaphthalene, 51.6 g (0.30 mol) of 6-hydroxy-2-naphthaldehyde, and 145 g of methyl cellosolve were added to a 1,000-mL flask, and 20 g of a 20 wt % methyl cellosolve solution of p-toluenesulfonic acid was added to the flask while the mixture in the flask was stirred at 70° C. to obtain a solution. The temperature of the solution was increased to 85° C. and stirred for 6 hours, and was then cooled to room temperature and diluted with 800 mL of ethyl acetate. The solution was transferred to a separatory funnel and repeatedly washed each with 200 mL of deionized water to remove the reaction catalyst and metal impurities. The resulting solution was concentrated under reduced pressure, 600 mL of ethyl acetate was added to the residue, and the mixture was poured into 2,400 mL of hexane to precipitate a polymer. The precipitated polymer was collected by filtration and then dried under reduced pressure to obtain a resin A1 having a repeating unit represented by the following formula. The resin A1 had a Mw of 3,200 and a dispersity (Mw/Mn) of 2.44.

Then, 20 parts by weight of the resin A1, 1 part by weight of an acid generator AG, and 4 parts by weight of a crosslinker, NIKALAC Mw 390 (manufactured by SANWA CHEMICAL CO., LTD.) were dissolved in 100 parts by weight of propylene glycol monomethyl ether acetate (PG-MEA) containing 0.1 wt % of FC-4430 (fluorine-based surfactant manufactured by 3M), and the resulting solution was passed through a fluororesin filter with a pore size of 0.1 µm to obtain a resin composition A1.

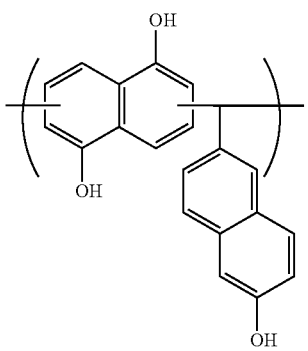

Preparation Example 2

First, 80 g (0.50 mol) of 1,5-dihydroxynaphthalene, 9.0 g (0.30 mol) of paraformaldehyde, and 145 g of methyl cellosolve were added to a 1,000-mL flask, and 20 g of a 20 wt % methyl cellosolve solution of p-toluenesulfonic acid was added to the flask while the mixture in the flask was stirred at 70° C. to obtain a solution. The temperature of the solution was increased to 85° C. and stirred for 6 hours, and was then cooled to room temperature and diluted with 800 mL of ethyl acetate. The solution was transferred to a separatory funnel and repeatedly washed each with 200 mL of deionized water to remove the reaction catalyst and metal impurities. The resulting solution was concentrated under reduced pressure, 600 mL of ethyl acetate was added to the residue, and the mixture was poured into 2,400 mL of hexane to precipitate a polymer. The precipitated polymer was collected by filtration and dried under reduced pressure to obtain a resin A2 having a repeating unit represented by the following formula. The resin A2 had a Mw of 1,500 and a Mw/Mn of 2.20.

Then, 20 parts by weight of the resin A2, 1 part by weight of an acid generator AG, and 4 parts by weight of a crosslinker, NIKALAC Mw 390 (manufactured by SANWA CHEMICAL CO., LTD.) were dissolved in 100 parts by weight of PGMEA containing 0.1 wt % of FC-4430 (manufactured by 3M), and the resulting solution was passed through a fluororesin filter with a pore size of 0.1 μm to obtain a resin composition A2.

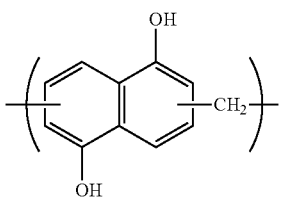

Preparation Example 3

First, 72 g (0.50 mol) of 1-naphthol, 51.6 g (0.30 mol) of 6-hydroxy-2-naphthaldehyde, and 145 g of methyl cellosolve were added to a 1,000-mL flask, and 20 g of a 20 wt % methyl cellosolve solution of p-toluenesulfonic acid was added to the flask while the mixture in the flask was stirred at 70° C. to obtain a solution. The temperature of the solution was increased to 85° C. and stirred for 6 hours, and was then cooled to room temperature and diluted with 800 mL of ethyl acetate. The solution was transferred to a separatory funnel and repeatedly washed each with 200 mL of deionized water to remove the reaction catalyst and metal impurities. The resulting solution was concentrated under reduced pressure, 600 mL of ethyl acetate was added to the residue, and the mixture was poured into 2,400 mL of hexane to precipitate a polymer. The precipitated polymer was collected by filtration and dried under reduced pressure to obtain a resin A3 having a repeating unit represented by the following formula. The resin A3 had a Mw of 2,700 and a Mw/Mn of 2.61.

Then, 20 parts by weight of the resin A3, 1 part by weight of an acid generator AG, and 4 parts by weight of a crosslinker, NIKALAC Mw 390 (manufactured by SANWA CHEMICAL CO., LTD.) were dissolved in 100 parts by weight of PGMEA containing 0.1 wt % of FC-4430 (manufactured by 3M), and the resulting solution was passed through a fluororesin filter with a pore size of 0.1 μm to obtain a resin composition A3.

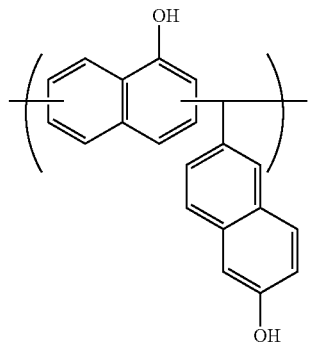

Comparative Preparation Example 1

First, 32.4 g (0.30 mol) of 2-methylhydroxybenzene, 51.6 g (0.30 mol) of 6-hydroxy-2-naphthaldehyde, and 145 g of methyl cellosolve were added to a 1,000-mL flask, and 20 g of a 20 wt % methyl cellosolve solution of p-toluenesulfonic acid was added to the flask while the mixture in the flask was stirred at 70° C. to obtain a solution. The temperature of the solution was increased to 85° C. and stirred for 6 hours, and was then cooled to room temperature and diluted with 800 mL of ethyl acetate. The solution was transferred to a separatory funnel and repeatedly washed each with 200 mL of deionized water to remove the reaction catalyst and metal impurities. The resulting solution was concentrated under reduced pressure, 600 mL of ethyl acetate was added to the residue, and the mixture was poured into 2,400 mL of hexane to precipitate a polymer. The precipitated polymer was collected by filtration and dried under reduced pressure to obtain a resin A4 having a repeating unit represented by the following formula. The resin A4 had a Mw of 2,100 and a Mw/Mn of 1.58.

Then, 20 parts by weight of the resin A4, 1 part by weight of an acid generator AG, and 4 parts by weight of a crosslinker, NIKALAC Mw 390 (manufactured by SANWA CHEMICAL CO., LTD.) were dissolved in 100 parts by weight of PGMEA containing 0.1 wt % of FC-4430 (manufactured by 3M), and the resulting solution was passed through a fluororesin filter with a pore size of 0.1 μm to obtain a resin composition A4.

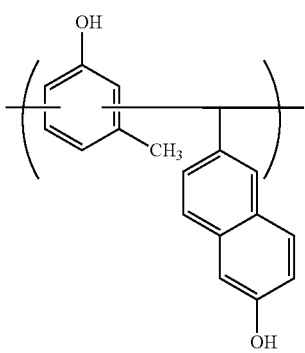

Preparation Example 4

First, 20 g of a polyphenylene ether resin, ZYLON® S201A (manufactured by Asahi Kasei Corporation, Mn=19,000) that is poly-2,6-dimethyl-1,4-phenylene ether was dissolved in 180 g of p-xylene to obtain a 10 wt % p-xylene solution of ZYLON® S201A. The solution was passed through a membrane filter with a pore size of 0.2 µm to obtain a resin composition B1. The glass transition temperature (Tg) of the resin was measured and found to be 216° C.

Preparation Example 5

First, 20 g of UNIFINER® M-2000H (manufactured by UNITIKA LTD.) that is a polyarylate resin was dissolved in 134 g of cyclohexanone to obtain a 13 wt % cyclohexanone solution of UNIFINERO M-2000H. The solution was passed through a membrane filter with a pore size of 0.2 µm to obtain a resin composition B2. The Tg of the resin was measured and found to be 270° C.

Preparation Example 6

First, 16 g of a polyimide resin, AURUM® PL450C (manufactured by Mitsui Chemicals, Inc.) was dissolved in 184 g of N-methyl-2-pyrrolidone to obtain an 8 wt % N-methyl-2-pyrrolidone solution of AURUM® PL450C. The solution was passed through a membrane filter with a pore size of 0.2 µm to obtain a resin composition B3. The glass transition temperature (Tg) of the resin was measured and found to be 250° C.

Comparative Preparation Example 2

First, 10 g of a hydrogenated polystyrene-based thermoplastic resin, SEPTON® 4033 (polystyrene-poly(ethylene/propylene)block-polystyrene copolymer manufactured by KURARAY CO., LTD., styrene content: 30 wt %) was dissolved in 190 g of mesitylene to obtain a 5 wt % mesitylene solution of SEPTON® 4033. The solution was passed through a membrane filter with a pore size of 0.2 µm to obtain a resin composition B4. The Tg of the resin was measured and found to be 105° C.

It is to be noted the Tg of the resin is measured in the following manner.

Each of the resin compositions B1 to B4 was heat-cured at 180° C. for 10 minutes to prepare a rectangular test sheet with a thickness of 0.5 mm and a size of 30 mm×10 mm. The tan δ of the prepared test sheet was measured with a dynamic viscoelasticity meter (DMA 7100 manufactured by Hitachi High-Technologies Corporation) under conditions of a frequency of 1 Hz, a temperature rise rate of 3° C./min, and a temperature range of 0 to 300° C. The peak (maximum) of the tan δ was defined as Tg.

[2] Preparation and Evaluation of Semiconductor Device

Examples 1 to 5 and Comparative Examples 1 to 4

The resin composition A1, A2, A3 or A4 was spin coated on a glass plate having a diameter of 200 mm (thickness: 500 µm), and then heated on a hot plate at 180° C. for 2 minutes and then at 250° C. for 5 minutes to form a resin layer A having a thickness shown in Table 1.

Further, the resin composition B1, B2, B3, or B4 was spin coated on the resin layer A, and then heated on a hot plate at 150° C. for 5 minutes and then at 180° C. for 5 minutes to form a resin layer B having a thickness shown in Table 1. It is to be noted that only the resin layer A was formed in Comparative Example 1, and only the resin layer B was formed in Comparative Example 2.

Then, the following tests were performed on the glass plates having the resin layer A and the resin layer B or the glass plates having only the resin layer A or the resin layer B. The results are shown in Table 1. It is to be noted that the tests were performed in the following order.

(1) Resistance to Repetitive Heating During Formation of Redistribution Layer and Curing of Multi-Layered Insulating Layer A polyimide silicone composition described in Example 2 of Japanese Patent No. 5,417,623 was spin coated on the resin layer B to have a thickness of 4 µm and heated at 100° C. to form an insulating layer. The insulating layer was patterned in the same manner as in Example 2 of Japanese Patent No. 5,417,623 and then heat cured in an oven at 220° C. for 1 hour to complete the patterned insulating layer. On the insulating layer and in the openings thereof, a Ti layer and a Cu layer were formed by sputtering to have a thickness of 0.05 µm and a thickness of 0.20 µm, respectively. Then, a positive resist composition described in Example 1 of Japanese Patent No. 6,003,855 was spin coated on the Cu layer to have a thickness of 10 µm to form a plating resist layer. The plating resist layer was patterned to provide openings, and then Cu was deposited in the openings by electrolytic plating to form a redistribution layer having a thickness of 5 µm. Then, the plating resist layer was removed by washing with PGMEA, and the Cu layer exposed at the surface was etched with phosphoric acid water at room temperature for 5 minutes. Then, the Ti layer was etched with buffered hydrofluoric acid at room temperature for 3 minutes. Further, the polyimide silicone composition was spin coated thereon to have a thickness of 4 µm to form an insulating layer in the same manner as described above. The insulating layer was patterned in the same manner as described above to provide openings in portions where the Cu redistribution layer was formed, and was then again heat cured in the oven at 220° C. for 1 hour to form a second insulating layer. Another insulating layer was formed in the same manner as described above to obtain a third insulating layer.

Finally, the thus obtained laminate was visually observed from the glass plate side. When separation was not found between layers from the glass plate to the resin layer B, the laminate was evaluated as good (○), and when any anomalies were found, the laminate was evaluated as defective (x).

(2) Chip Mounting on Redistribution Layer and Filling with Underfill Agent

A chip having SnAg bumps was mounted on the Cu redistribution layer of the laminate. Then, a space between the chip and the insulating layer was filled with an underfill agent described in Example 1 of Japanese Patent 5,579,764 and heat cured at 120° C. for 0.5 hours and then at 165° C. for 3 hours. After curing, the laminate was visually observed from the glass plate side. When separation was not found between layers from the glass plate to the resin layer B, the laminate was evaluated as good (○), and when any anomalies were found, the laminate was evaluated as defective (x).

(3) Formation of Mold Resin Layer on Chip Layer

A mold material used herein was a film-form mold resin that was a multi-layered film composed of a release film (1), a resin film, and a release film (2) described in Example 7 of JP-A 2016-088952. The release film (2) was removed, and the resin film was attached to the second insulating layer in a batch at 110° C. with the use of a vacuum laminator (manufactured by Takatori Corporation, product name: TEAM-100RF) whose vacuum chamber was set at a vacuum of 250 Pa. The pressure in the vacuum chamber was returned to ordinary pressure, and then the laminate was cooled to 25° C. and taken out of the vacuum laminator. Then, the remaining release film (1) was removed. The resulting laminate was heated in an inert oven at 180° C. for 2 hours to cure the resin to form a mold resin layer. Finally, the laminate was visually observed from the glass plate side. When separation was not found between layers from the glass plate to the resin layer B, the laminate was evaluated as good (○), and when any anomalies were found, the laminate was evaluated as defective (x).

(4) Test for Support Separability

The separability of the support was evaluated in the following manner. First, the mold resin layer of the laminate molded in (3) was vacuum-adsorbed to a chuck platen. Then, the entire surface was irradiated with laser of 355 nm from the support side. When the support was separated without being broken, the laminate was evaluated as good (○), and when the support was broken or other anomalies occurred, the laminate was evaluated as defective (x).

(5) Test for Removability by Washing

After the completion of the separability test, a test for removability by solvent washing was performed in the following manner. The laminate including the insulating layer and the mold resin layer was immersed in a washing solvent with the resin layer B facing upward. As the washing solvent, p-xylene was used when the resin composition B1 was used, cyclohexanone was used when the resin composition B2 was used, and N-methyl-2-pyrrolidone was used when the resin composition B3 was used. The test included washing by immersion in a washing solvent for 5 minutes and subsequent rinsing by immersion in isopropyl alcohol (IPA). Then, the appearance of the laminate was visually observed to determine the presence or absence of the remaining resin layer B. When residues derived from the resin layer B were not observed, the laminate was evaluated as good (○), and when residues derived from the resin layer B were observed, the laminate was evaluated as defective (x).

(6) Permeability Test

The resin composition A1, A2, A3, or A4 was spin coated on a 500 μm-thick glass substrate to have a thickness of 0.3 μm, and was then heat cured at 250° C. for 5 minutes to form a resin layer A. The transmittance (at wavelength 355 nm) of the resin layer A was measured using a spectrophotometer (U-4100 manufactured by Hitachi High-Tech Science Corporation). When the transmittance was 20% or less, the resin layer A was evaluated as good (○), and when the transmittance was higher than 20%, the resin layer A was evaluated as defective (x). It is to be noted that the transmittance is shown in parentheses.

TABLE 1

|  |  | Example | | | | | Comparative Example | | | |
| --- | --- | --- | --- | --- | --- | --- | --- | --- | --- | --- |
|  |  | 1 | 2 | 3 | 4 | 5 | 1 | 2 | 3 | 4 |
| Resin layer A | Resin composition | A1 | A2 | A3 | A3 | A3 | A1 | — | A4 | A3 |
|  | Thickness (μm) | 0.3 | 0.3 | 0.3 | 0.3 | 0.3 | 0.3 | — | 0.3 | 0.3 |
|  | Transmittance | ○ (7%) | ○ (12%) | ○ (9%) | ○ (9%) | ○ (9%) | ○ (7%) | — | x (35%) | ○ (9%) |
| Resin layer B | Resin composition | B1 | B1 | B1 | B2 | B3 | — | B1 | B1 | B4 |
|  | Thickness (μm) | 2 | 2 | 2 | 5 | 3 | — | 2 | 2 | 6 |
|  | Glass transition temperature (° C.) | 216 | 216 | 216 | 270 | 250 | — | 216 | 216 | 105 |
| Resistance to repetitive heating | | ○ | ○ | ○ | ○ | ○ | ○ | ○ | ○ | x |
| Chip mounting on redistribution layer | | ○ | ○ | ○ | ○ | ○ | ○ | ○ | ○ | — |
| Formation of mold resin layer on chip layer | | ○ | ○ | ○ | ○ | ○ | ○ | ○ | ○ | — |
| Support separability | | ○ | ○ | ○ | ○ | ○ | ○ | x | x | — |
| Removability by washing | | ○ | ○ | ○ | ○ | ○ | x | — | — | — |

As can be seen from Table 1, in Examples 1 to 5, laminate formation, support separation, and resin layer removal were easily performed. On the other hand, in Comparative Example 1, residues resulting from the resin layer A were observed on the insulating layer after washing. In Comparative Examples 2 and 3, the support was not separated after laser irradiation but broken. In Comparative Example 4, any problem did not occur after curing of the second insulating layer, but separation occurred at the interface between the resin layer B and the interface between the resin layer B and the insulating layer after curing of the third insulating layer.

Japanese Patent Application No. 2017-193635 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A semiconductor device comprising: a support; a double-layered adhesive resin layer formed on the support, an insulating layer and a redistribution layer formed on the adhesive resin layer; a chip layer, and a mold resin layer, wherein
   the adhesive resin layer comprises a resin layer A containing a resin decomposable by light irradiation and a resin layer B containing a non-silicone-based thermoplastic resin, the resin layer A and the resin layer B being provided in this order from the support side, the resin decomposable by light irradiation is a resin containing a fused ring in its main chain, and the non-silicone-based thermoplastic resin has a glass transition temperature of 200° C. or higher.

2. The semiconductor device according to claim 1, wherein the resin layer A has a light transmittance at a wavelength of 355 nm of 20% or less.

3. The semiconductor device according to claim 1, wherein the resin layer A is formed of a cured product of a resin composition A containing a resin A having a repeating unit represented by the following formula (1):

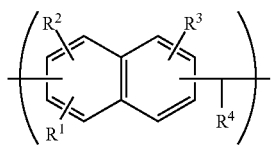

wherein $R^1$ to $R^3$ are each independently a hydrogen atom, a hydroxy group, or a monovalent organic group having 1 to 20 carbon atoms, at least one of $R^1$ to $R^3$ is a hydroxy group, and $R^4$ is a hydrogen atom or a monovalent organic group having 1 to 30 carbon atoms which may have a substituent.

4. The semiconductor device according to claim 1, wherein the non-silicone-based thermoplastic resin contains an aromatic ring in its main chain.

5. A method for producing the semiconductor device according to claim 1, comprising the steps of:
   (a) forming a resin layer A directly on a support;
   (b) forming a resin layer B on the resin layer A;
   (c) forming an insulating layer on the resin layer B and patterning the insulating layer;
   (d) forming a conductive layer on the patterned insulating layer;
   (e) forming a plating resist layer on the conductive layer and patterning the plating resist layer to expose the conductive layer between pattern features of the plating resist layer;
   (f) forming a redistribution layer on an exposed portion of the conductive layer between pattern features of the plating resist layer;
   (g) removing the plating resist layer to expose the conductive layer and removing the exposed conductive layer;
   (h) forming a second insulating layer after the step (g) and patterning the second insulating layer to expose the redistribution layer;
   (i) forming a chip layer on the redistribution layer;
   (j) filling a space between the chip layer and the insulating layer with an underfill agent; and
   (k) forming a mold resin layer on the chip layer.

6. A laminate comprising: a support; a double-layered adhesive resin layer formed on the support, an insulating layer formed on the adhesive resin layer; and a plating resist layer, wherein
   the adhesive resin layer comprises a resin layer A containing a resin decomposable by light irradiation and a resin layer B containing a non-silicone-based thermoplastic resin, the resin layer A and the resin layer B being provided in this order from the support side, the resin decomposable by light irradiation is a resin containing a fused ring in its main chain, and the non-silicone-based thermoplastic resin has a glass transition temperature of 200° C. or higher.

* * * * *